(12) United States Patent
Wang et al.

(10) Patent No.: US 11,340,440 B2
(45) Date of Patent: May 24, 2022

(54) REAL-TIME MONITORING MICROSCOPIC IMAGING SYSTEM FOR NITRIDE MOCVD EPITAXIAL GROWTH MODE

(71) Applicant: UNIVERSITY OF ELECTRONIC SCIENCE AND TECHNOLOGY OF CHINA, Sichuan (CN)

(72) Inventors: Chao Wang, Sichuan (CN); Xueke Gou, Sichuan (CN); Jing Jiang, Sichuan (CN); Jun Hu, Sichuan (CN); Zezhan Zhang, Sichuan (CN); Yang Yang, Sichuan (CN); Ying Duan, Sichuan (CN); Congjun Wu, Sichuan (CN); Yueming Wang, Sichuan (CN)

(73) Assignee: UNIVERSITY OF ELECTRONIC SCIENCE AND TECHNOLOGY OF CHINA, Sichuan (CN)

( * ) Notice: Subject to any disclaimer, the term of this patent is extended or adjusted under 35 U.S.C. 154(b) by 220 days.

(21) Appl. No.: 16/622,868

(22) PCT Filed: Mar. 22, 2019

(86) PCT No.: PCT/CN2019/079372
§ 371 (c)(1),
(2) Date: Dec. 13, 2019

(87) PCT Pub. No.: WO2019/144975
PCT Pub. Date: Aug. 1, 2019

(65) Prior Publication Data
US 2020/0209606 A1 Jul. 2, 2020

(30) Foreign Application Priority Data

Jan. 23, 2018 (CN) .......................... 201810061974.9

(51) Int. Cl.
*G02B 21/36* (2006.01)
*G02B 21/02* (2006.01)
(Continued)

(52) U.S. Cl.
CPC ....... *G02B 21/361* (2013.01); *G02B 17/0808* (2013.01); *G02B 21/0016* (2013.01);
(Continued)

(58) Field of Classification Search
CPC ........ H01L 21/02271; H01L 21/67253; G02B 17/08; G02B 17/0804; G02B 17/0808;
(Continued)

(56) References Cited

FOREIGN PATENT DOCUMENTS

| CN | 107267964 A | * | 10/2017 | ........... C23C 16/481 |
| KR | 20140097577 A | * | 8/2014 | ......... G02B 17/0844 |

* cited by examiner

*Primary Examiner* — Stephone B Allen
*Assistant Examiner* — Adam W Booher

(57) ABSTRACT

A real-time monitoring microscopic imaging system for nitride MOCVD (metal organic chemical vapor deposition) epitaxial growth mode includes an observation window, an imaging lens set, a CCD (charge coupled device) camera, an image capture card and an image storage and display device, wherein: the observation window is provided at a top portion of a graphite carrier in an MOCVD reaction chamber and is formed by a thicker quartz glass to prevent temperature in the reaction chamber from damaging the lenses. The microscopic imaging system provided by the present invention has the resolution better than 1 µm, is able to distinguish the 2D growth mode and the 3D growth mode, observe whether the surface of the epitaxial wafer has screw dislocations in the MOCVD process, so as to observe the growth mode of the MOCVD epitaxial wafer in real time during the growth process.

8 Claims, 1 Drawing Sheet

(51) Int. Cl.
  *H01L 21/67*        (2006.01)
  *G02B 21/00*        (2006.01)
  *G02B 17/08*        (2006.01)
  *G02B 21/04*        (2006.01)
  *C23C 16/52*        (2006.01)
  *H01L 21/02*        (2006.01)

(52) U.S. Cl.
  CPC .............. *G02B 21/02* (2013.01); *G02B 21/04* (2013.01); *G02B 21/368* (2013.01); *H01L 21/67253* (2013.01); *C23C 16/52* (2013.01); *H01L 21/02271* (2013.01)

(58) Field of Classification Search
  CPC .... G02B 21/361; G02B 21/02; G02B 21/368; G02B 21/364; G02B 21/24; G02B 21/04; G02B 21/0004; G02B 21/0016; C23C 16/52
  See application file for complete search history.

REAL-TIME MONITORING MICROSCOPIC IMAGING SYSTEM FOR NITRIDE MOCVD EPITAXIAL GROWTH MODE

CROSS REFERENCE OF RELATED APPLICATION

This is a U.S. National Stage under 35 U.S.C 371 of the International Application PCT/CN2019/079372, filed Mar. 22, 2019, which claims priority under 35 U.S.C. 119(a-d) to CN 201810061974.9, filed Jan. 23, 2018.

BACKGROUND OF THE PRESENT INVENTION

Field of Invention

The present invention relates to the field of optical technology, and more particularly to a high-resolution real-time monitoring microscopic imaging system for nitride MOCVD (metal organic chemical vapor deposition) epitaxial growth mode.

Description of Related Arts

High performance materials grown through MOCVD (metal organic chemical vapor deposition) epitaxy is highly dependent on the quality control of the epitaxial process. One of the most critical technologies in MOCVD equipment is to monitor the material growth process for obtaining real-time growth information, and then adjusting the growth status. The monitoring equipment is the eye of the growth process and is the core component of the series of high-end equipment involved in this process. Researches on characterizing the growth mode of MOCVD epitaxial wafers have begun very early, but until now there is no ready-made technology or product capable of characterizing growth modes in real time in epitaxial process. The most intuitive way to characterize growth modes is microscopic imaging. The existing microscopic imaging techniques used in MOCVD are scanning near field optical imaging technology and scanning tunneling microscope technique. However, these two techniques need to terminate the growth process and take out the epitaxial wafer for observation, which is unable to monitor in real time, resulting in high cost and poor effect. Therefore, the monitoring device commonly used in MOCVD equipment at present monitors the epitaxial growth of thin film by non-contact optics, which measures the growth rate derived from the reflectance of the optical path. However, this method is an indirect measurement method whose accuracy is affected by many factors and is not as effective as intuitive microscopic observation. In addition, when the real-time microscopic imaging for epitaxial growth mode achieves a resolution better than 1 µm, the image capable of distinguishing 2D growth mode and 3D growth mode is able to be presented for monitoring in real time, and however, the aberration problem and the longitudinal volume problem of the imaging system which occur in the process of light transmission are difficult to be solved at the same time. At present, no imaging system has been designed which is able to achieve high resolution and image quality. Accordingly, the present invention provides a special microscopic imaging system, wherein a protective window is provided at a top portion of a reaction chamber to directly extract and observe feature points, which is intuitive and specific, reduces the error introduction links in other indirect or offline measurements, ensures the authenticity and the detection sensitivity of information such as growth morphology, is able to accurately and timely feedback MOCVD epitaxial growth information. Moreover, the refracting and reflecting lens set not only reduces the longitudinal volume of the light, but also greatly reduces the aberration of the imaging, so that the CCD camera receives a clear image. The image is processed by an image capture card and then displayed in a display. Furthermore, the detection time interval of the CCD camera is 0.05 s, which greatly reduces the influence of the rotation of the graphite carrier on the imaging quality. The present invention is able to observe whether the surface of the epitaxial wafer has screw dislocations in the MOCVD process, distinguish the 2D growth mode and the 3D growth mode, and solve the problem of image resolution and image quality of the epitaxial wafer.

SUMMARY OF THE PRESENT INVENTION

In order to monitor the growth mode of nitride MOCVD epitaxy in real time, the present invention provides a real-time monitoring microscopic imaging system, which is able to intuitively observe the evolution of the growth mode of nitride and observe whether the screw dislocation is generated, so as to solve the problem that the growth of the epitaxial wafer is unable to be accurately obtained in real time, thus the worker or the computer automatically performs processing in real time according to the problem generated during the growth process.

A technical solution of the present invention is to provide a real-time monitoring microscopic imaging system for nitride MOCVD (metal organic chemical vapor deposition) epitaxial growth mode. The system comprises: a growth room, a protective lens defining an observation window, an imaging lens set, a CCD (charge coupled device) camera, an image capture card and an image storage and display device, wherein:

the CCD camera is configured to obtain images of a nitride MOCVD epitaxial layer in the growth room through the imaging lens set, wherein data collected by the CCD camera are processed by the image capture card, and finally stored and displayed by the image storage and display device;

the protective lens is provided at a top portion of the growth room and is made from fused quartz;

the imaging lens set comprises a first meniscus lens, a second meniscus lens, a third meniscus lens, a first convex lens, a second convex lens, a concave lens, a fourth meniscus lens, and the fifth meniscus lens in sequence, wherein both the fourth meniscus lens and the fifth meniscus lens are reflective lenses; a concave surface of all of the first, second, third and fifth meniscus lens faces towards an object to be measured, a concave surface of the fourth meniscus lens faces towards an imaging surface; the fourth meniscus lens and the fifth meniscus lens form a Cassegrain system.

Parameters of the first meniscus lens are as follows. Radiuses of curvature of the object to be measured to two lens surfaces of the first meniscus lens are respectively −978.0965 mm and −68.686 mm, a thickness of the first meniscus lens is 25 mm, a refractive index of the first meniscus lens is 1.435, a distance between the first meniscus lens and the protective lens disposed in front of the first meniscus lens is 25 mm, a diameter of the first meniscus lens is 95 mm.

Parameters of the second meniscus lens are as follows. Radiuses of curvature of the object to be measured to two lens surfaces of the second meniscus lens are respectively −239.36 mm and −129.678 mm, a thickness of the second meniscus lens is 25 mm, a refractive index of the second meniscus lens is 1.393, a distance between the second meniscus lens and the first meniscus lens disposed in front of the second meniscus lens is 1 mm, a diameter of the second meniscus lens is 100 mm.

Parameters of the third meniscus lens are as follows. Radiuses of curvature of the object to be measured to two lens surfaces of the third meniscus lens are respectively −73.571 mm and −148.901 mm, a thickness of the third meniscus lens is 20 mm, a refractive index of the third meniscus lens is 1.694, a distance between the third meniscus lens and the second meniscus lens disposed in front of the third meniscus lens is 10.975 mm, a diameter of the third meniscus lens is 120 mm.

Parameters of the first convex lens are as follows. Radiuses of curvature of the object to be measured to two lens surfaces of the first convex lens are respectively 264.753 mm and −257.137 mm, a thickness of the first convex lens is 25 mm, a refractive index of the first convex lens is 1.615, a distance between the first convex lens and the third meniscus lens disposed in front of the first convex lens is 2 mm, a diameter of the first convex lens is 135 mm.

Parameters of the second convex lens are as follows. Radiuses of curvature of the object to be measured to two lens surfaces of the second convex lens are respectively 751.196 mm and −1325.838 mm, a thickness of the second convex lens is 25 mm, a refractive index of the second convex lens is 1.933, a distance between the second convex lens and the first convex lens disposed in front of the second convex lens is 3 mm, a diameter of the second convex lens is 135 mm.

Parameters of the concave lens are as follows. Radiuses of curvature of the object to be measured to two lens surfaces of the concave lens are respectively −207.879 mm and 337.107 mm, a thickness of the concave lens is 18 mm, a refractive index of the concave lens is 1.658, a distance between the concave lens and the second convex lens disposed in front of the concave lens is 10.053 mm, a diameter of the concave lens is 130 mm.

A radius of curvature of a lens surface of the fourth meniscus lens which plays a reflex role is −34.848 mm, a diameter of the fourth meniscus lens is 30 mm, and a distance between the fourth meniscus and the concave lens is 14 mm. A radius of curvature of a lens surface of the fifth meniscus lens which plays a reflex role is −155.402 mm, a diameter of the fifth meniscus lens is 150 mm, and a distance between the fifth meniscus and the concave lens is 90 mm.

The imaging lens set provided by the present invention adopts a catadioptric design to minimize the longitudinal volume of the system, and reduces the aberration of the system to ensure the final image quality. The optical magnification of the imaging lens set is 10 times. Since the pixels of the CCD in the CCD camera are generally larger than 2.5 µm, and the imaging resolution is larger than the pixels, the magnification of 10 times ensures that the resolution of the final imaging is better than 1 µm, and the processor of the CCD camera digitally magnifies the images, so that the final images are magnified by a certain magnification, thereby finally the growth of the epitaxial wafer is observed on the display. In addition, all information of the observed object is measured through the observation window at the top portion of the growth room, thereby ensuring that the growth process in the reaction chamber is not affected by the outside world. Through the real-time monitoring microscopic imaging system provided by the present invention, the microscopic image information of the epitaxial wafer is directly acquired, so as to obtain the information of the growth mode; and through the real-time information acquired by the real-time monitoring microscopic imaging system, the growth state of the epitaxial wafer in the MOCVD reaction chamber is able to be accurately adjusted. The feature points are extracted and observed directly by the real-time monitoring microscopic imaging system with an ultra-long working distance, which is intuitive and specific and reduces the error introduction in other indirect or off-line measurements, ensuring the authenticity and detection sensitivity of the growth morphology and other information. The vacuum sealing structure formed between the protective glass and the first meniscus lens allows the conduction of temperature to only have a radiation effect, which is a good solution to the lens temperature change caused by heat conduction and convection. The imaging lens set adopting the catadioptric design reduces the longitudinal volume of the system, reduces the aberration of the system and ensures the image quality, so that after the light is received by the detector, the resolution is better than 1 µm and the image quality is guaranteed. The taking time interval of the CCD camera is 0.05 s, which greatly eliminates the influence of the uniform rotation of the graphite carrier carrying the epitaxial wafer on the imaging in the reaction cavity during the growth of the epitaxial wafer. After transferring the images through the image capture card to the image display, the image is further digitally amplified throughout the transfer process, and finally the evolution of the real-time micro-region growth mode of the epitaxial wafer is observed, providing a reliable reference basis for real-time control of the growth environment in the reaction chamber.

Figure 1:
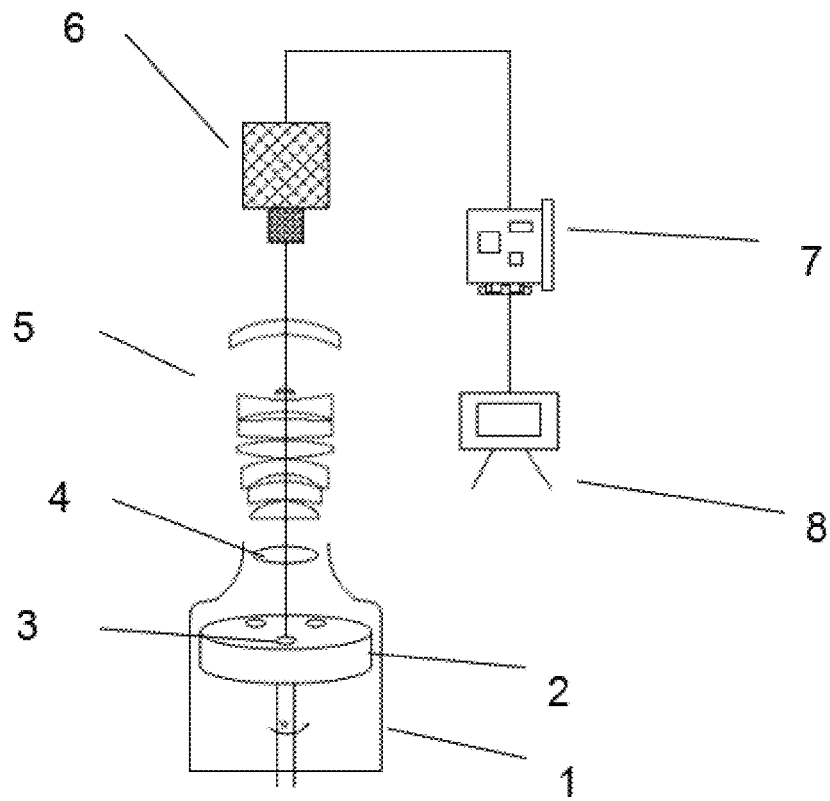
FIG. 1 is an optical flow diagram of a real-time monitoring microscopic imaging system provided by the present invention.

In the drawings, 1: reaction chamber; 2: graphite carrier; 3: epitaxial wafer; 4: observation window; 5: imaging lens set; 6: CCD (charge coupled device) camera; 7: image capture card; 8: image display; 9: first meniscus lens; 10: second meniscus lens; 11: third meniscus lens; 12: first convex lens; 13: second convex lens; 14: concave lens; 15: fourth meniscus lens; 16: fifth meniscus lens.

DETAILED DESCRIPTION OF THE PREFERRED EMBODIMENT

The present invention will be further described in detail with reference to accompanying drawings and embodiments as follows.

Figure 2:
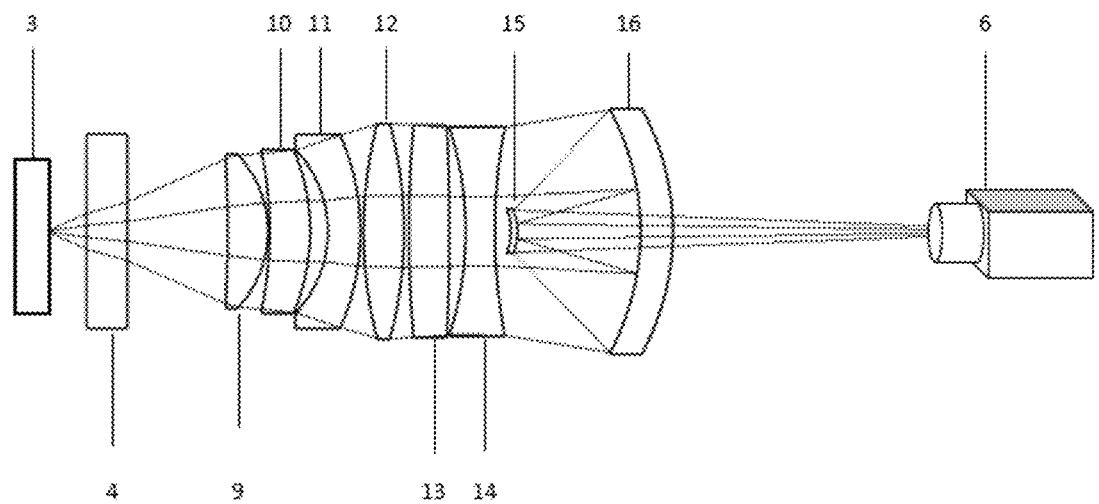
FIG. 2 is a schematic diagram of optical paths of the real-time monitoring microscopic imaging system with an ultra-long working distance.

As shown in FIG. 2, an epitaxial wafer is disposed on a sapphire substrate carried by a graphite carrier in a MOCVD (metal organic chemical vapor deposition) reaction chamber which is also called to a growth room, a growth material is deposited on the substrate, the graphite carrier rotates at a constant speed during the growth process, and the temperature in the reaction chamber is generally in a range of 600 to 1000° C.

The observation window is defined by a protective glass which is provided at a top portion of the reaction chamber and 3 cm away from the epitaxial wafer. The protective glass is made from fused quartz which has good thermal insulation capability for ensuring that the temperature inside the reaction chamber is not affected by the external environment; and at the same time, has a high transmittance for the imaging wavelength, so that there is almost no loss when the light is transmitted to the outside. The protective glass with a thickness of 3 cm and a first meniscus lens of the imaging lens set form a sealing structure, an interior of the sealing structure is vacuum, a distance between the protective glass and the first meniscus lens 5.5 cm, so as to allow only radiant energy to reach the lenses, thereby ensuring that the lenses are not damaged by high temperatures. A distance between the epitaxial wafer and the first meniscus lens is 11.5 cm, the working distance is long, and the imaging lens set has a catadioptric structure. The first meniscus lens, the second meniscus lens, the third meniscus lens, the first convex lens, the second convex lens and the concave lens are common adjustment modes, all of which refract the light to reduce the longitudinal volume of the system, and at the same time eliminate the aberration of the system by the combination of multiple lenses, so that the aberration of the light on the CCD camera is very small; the fourth meniscus lens and the fifth meniscus lens form a Cassegrain system for realizing the amplification function of the system, so that the light is enlarged 10 times of the original image at the imaging position, and the distance between the imaging position to the imaging lens set is greatly shortened. As shown in FIG. 2, the light from the observation window passes through the former six lenses and then reaches the Cassegrain system formed by the latter two lenses, and then focuses on an image surface, and finally received by a CCD (charge coupled device) camera. An optical magnification of the entire catadioptric structure is 10 times, and an overall length thereof is 26 cm and a height thereof is no more than 15 cm. The image capture time interval of the CCD camera is less than 0.05 s, and a clear image is able to be obtained when the CCD camera is about 26 cm away from the imaging lens set. A numerical aperture of the entire imaging lens set is 0.4, an optical resolution of the entire imaging lens set to the light with a wavelength of 0.55 μm is expressed by $$\sigma = \frac{0.61\lambda}{N_A},$$

namely, 0.84 μm, an optical magnification is 10 times, and a transfer function imaging in a range of 0 to 3 mm is greater than 0.2, which meets the most basic imaging requirements.

The pixels of the CCD processor in the CCD camera are 5 μm, and the CCD size is ⅓ inches, and finally the images are transmitted to a 9-inch image display with a digital magnification of 38.1 times. The image information received by the CCD processor in the CCD camera is transmitted to the image display through the image capture card, and then is digitally amplified to a certain magnification, and finally images with a resolution better than 1 μm is obtained, which displays the evolution of the micro-region growth mode of the epitaxial wafer. Finally, real-time monitoring of the nitride MOCVD epitaxial growth mode is achieved.

The parameters of each lens shown in FIG. 2 are as follows:

| Lens | R (mm) | W (mm) | $N_d$ | M (mm) | D (mm) |
|---|---|---|---|---|---|
| 9 | −978.0965<br>−68.686 | 25 | 1.435 | 25 | 95 |
| 10 | −239.36<br>−129.678 | 25 | 1.393 | 1 | 100 |
| 11 | −73.571<br>−148.901 | 20 | 1.694 | 10.975 | 120 |

-continued

| Lens | R (mm) | W (mm) | $N_d$ | M (mm) | D (mm) |
|---|---|---|---|---|---|
| 12 | 264.753<br>−257.137 | 25 | 1.615 | 2 | 135 |
| 13 | 751.196<br>−1325.838 | 25 | 1.933 | 3 | 135 |
| 14 | −207.879<br>337.107 | 18 | 1.658 | 10.053 | 130 |

What is claimed is:

1. A real-time monitoring microscopic imaging system for nitride MOCVD (metal organic chemical vapor deposition) epitaxial growth mode, comprising: a growth room, a protective lens defining an observation window, an imaging lens set, a CCD (charge coupled device) camera, an image capture card, and an image storage and display device, wherein:
   the CCD camera is configured to obtain images of a nitride MOCVD epitaxial layer in the growth room through the imaging lens set, wherein data collected by the CCD camera are processed by the image capture card, and finally stored and displayed by the image storage and display device;
   the protective lens is provided at a top portion of the growth room and is made from fused quartz;
   the imaging lens set comprises a first meniscus lens, a second meniscus lens, a third meniscus lens, a first convex lens, a second convex lens, a concave lens, a fourth meniscus lens, and a fifth meniscus lens in sequence, wherein both the fourth meniscus lens and the fifth meniscus lens are reflective lenses; a concave surface of each of the first, second, third and fifth meniscus lens faces towards an object to be measured, a concave surface of the fourth meniscus lens faces towards an imaging surface; the fourth meniscus lens and the fifth meniscus lens form a Cassegrain system.

2. The real-time monitoring microscopic imaging system for nitride MOCVD epitaxial growth mode, as recited in claim 1, wherein: parameters of the first meniscus lens are that radiuses of curvature of two lens surfaces of the first meniscus lens are respectively −978.0965 mm and −68.686 mm, a thickness of the first meniscus lens is 25 mm, a refractive index of the first meniscus lens is 1.435, a distance between the first meniscus lens and the protective lens disposed in front of the first meniscus lens is 25 mm, a diameter of the first meniscus lens is 95 mm.

3. The real-time monitoring microscopic imaging system for nitride MOCVD epitaxial growth mode, as recited in claim 1, wherein: parameters of the second meniscus lens are that radiuses of curvature of two lens surfaces of the second meniscus lens are respectively −239.36 mm and −129.678 mm, a thickness of the second meniscus lens is 25 mm, a refractive index of the second meniscus lens is 1.393, a distance between the second meniscus lens and the first meniscus lens disposed in front of the second meniscus lens is 1 mm, a diameter of the second meniscus lens is 100 mm.

4. The real-time monitoring microscopic imaging system for nitride MOCVD epitaxial growth mode, as recited in claim 1, wherein: parameters of the third meniscus lens are that radiuses of curvature of two lens surfaces of the third meniscus lens are respectively −73.571 mm and −148.901 mm, a thickness of the third meniscus lens is 20 mm, a refractive index of the third meniscus lens is 1.694, a distance between the third meniscus lens and the second meniscus lens disposed in front of the third meniscus lens is 10.975 mm, a diameter of the third meniscus lens is 120 mm.

5. The real-time monitoring microscopic imaging system for nitride MOCVD epitaxial growth mode, as recited in claim 1, wherein: parameters of the first convex lens are that radiuses of curvature of two lens surfaces of the first convex lens are respectively 264.753 mm and −257.137 mm, a thickness of the first convex lens is 25 mm, a refractive index of the first convex lens is 1.615, a distance between the first convex lens and the third meniscus lens disposed in front of the first convex lens is 2 mm, a diameter of the first convex lens is 135 mm.

6. The real-time monitoring microscopic imaging system for nitride MOCVD epitaxial growth mode, as recited in claim 1, wherein: parameters of the second convex lens are that radiuses of curvature of two lens surfaces of the second convex lens are respectively 751.196 mm and −1325.838 mm, a thickness of the second convex lens is 25 mm, a refractive index of the second convex lens is 1.933, a distance between the second convex lens and the first convex lens disposed in front of the second convex lens is 3 mm, a diameter of the second convex lens is 135 mm.

7. The real-time monitoring microscopic imaging system for nitride MOCVD epitaxial growth mode, as recited in claim 1, wherein: parameters of the concave lens are that radiuses of curvature of two lens surfaces of the concave lens are respectively −207.879 mm and 337.107 mm, a thickness of the concave lens is 18 mm, a refractive index of the concave lens is 1.658, a distance between the concave lens and the second convex lens disposed in front of the concave lens is 10.053 mm, a diameter of the concave lens is 130 mm.

8. The real-time monitoring microscopic imaging system for nitride MOCVD epitaxial growth mode, as recited in claim 1, wherein: a radius of curvature of a lens surface of the fourth meniscus lens which plays a reflex role is −34.848 mm, a diameter of the fourth meniscus lens is 30 mm, and a distance between the fourth meniscus and the concave lens is 14 mm; a radius of curvature of a lens surface of the fifth meniscus lens which plays a reflex role is −155.402 mm, a diameter of the fifth meniscus lens is 150 mm, and a distance between the fifth meniscus and the concave lens is 90 mm.

* * * * *